United States Patent [19] [11] 4,271,422
Ipri [45] Jun. 2, 1981

[54] CMOS SOS WITH NARROW RING SHAPED P SILICON GATE COMMON TO BOTH DEVICES

[75] Inventor: Alfred C. Ipri, Princeton, N.J.

[73] Assignee: RCA Corporation, New York, N.Y.

[21] Appl. No.: 944,340

[22] Filed: Sep. 21, 1978

Related U.S. Application Data

[62] Division of Ser. No. 852,931, Nov. 18, 1977, abandoned.

[30] Foreign Application Priority Data

Feb. 28, 1977 [GB] United Kingdom ............... 8264/77

[51] Int. Cl.³ ............... H01L 27/12; H01L 29/78; H01L 21/22; H01L 21/28
[52] U.S. Cl. ............... 357/42; 29/571; 357/23; 357/49; 357/59
[58] Field of Search ............... 357/23, 59, 41, 4, 42, 357/49

[56] References Cited

U.S. PATENT DOCUMENTS

| | | | |
|---|---|---|---|
| 3,890,632 | 6/1975 | Ham et al. | 357/23 |
| 4,026,740 | 5/1977 | Owen | 29/580 |
| 4,124,933 | 11/1978 | Nicholas | 29/591 |

*Primary Examiner*—William D. Larkins
*Attorney, Agent, or Firm*—Birgit E. Morris; D. S. Cohen; Lawrence P. Benjamin

[57] ABSTRACT

A layer of polycrystalline silicon is coated with a masking layer leaving at least one edge of the silicon layer exposed. A P-type dopant is diffused into the exposed edge of the silicon layer so that the dopant diffuses laterally along the silicon layer a desired distance. The masking layer is then removed and the undoped portion of the silicon layer is removed by an etchant which does not etch the doped portion of the silicon layer. This leaves the narrow strip of the doped silicon which can be used as the gate electrode of an MOS transistor and/or as an interconnection in an integrated circuit. Since the lateral diffusion of the dopant can be accurately controlled, narrow strips of the doped silicon can be achieved.

2 Claims, 14 Drawing Figures

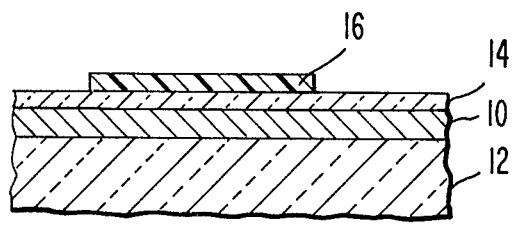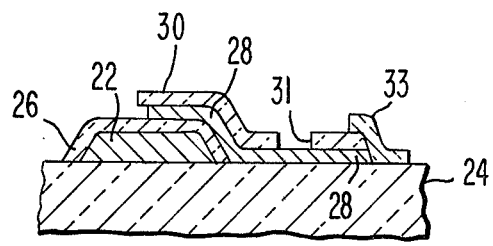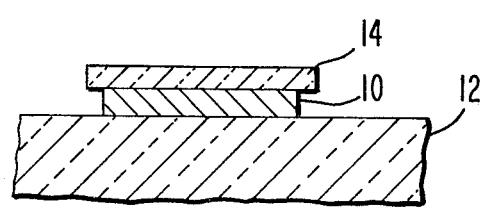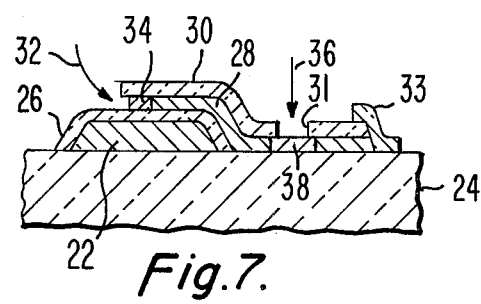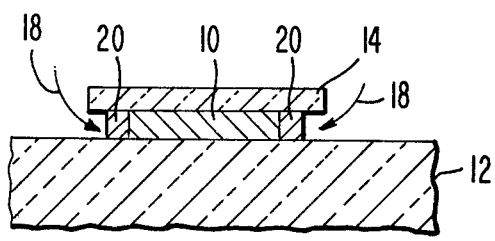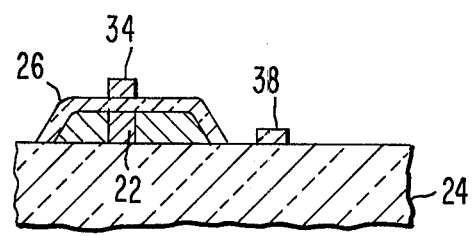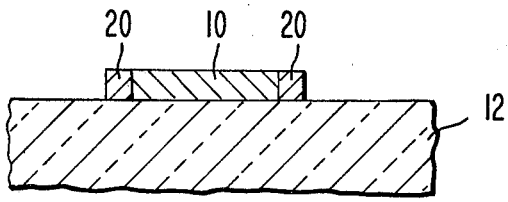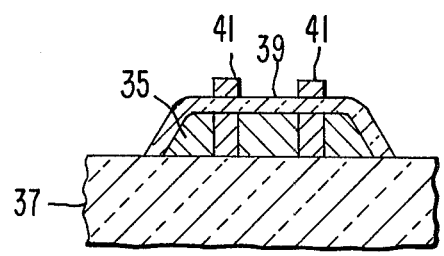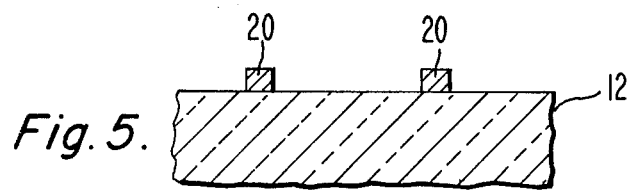

4,271,422

CMOS SOS WITH NARROW RING SHAPED P SILICON GATE COMMON TO BOTH DEVICES

This is a division of application Ser. No. 852,931, filed Nov. 18, 1977, now abandoned.

BACKGROUND OF THE INVENTION

The present invention relates to method of making narrow lines of polycrystalline silicon which can be used, for example, as the gate of an MOS transistor and/or an interconnection conduction of an integrated circuit and semiconductor devices utilizing such narrow lines.

It is known to use polycrystalline silicon as the gate for MOS transistors and as an interconnection between MOS transistors and other electrical components of an integrated circuit. It is also known that it is desirable to have the gate of an MOS transistor as narrow as possible. Heretofore, the polycrystalline gates have generally been defined in width using standard photolithographic techniques which have a limit on the narrowness that can be achieved. Another technique which has been developed to define a polycrystalline gate is described in U.S. Pat. No. 3,738,880, to A. Laker, issued June 13, 1973, entitled "METHOD OF MAKING A SEMICONDUCTOR DEVICE." In this technique, a P-type dopant is diffused into a polycrystalline silicon layer through an opening in a masking layer, such as a silicon dioxide layer, to form a doped strip or line in the polycrystalline silicon layer. After removing the masking layer, the undoped portion of the polycrystalline silicon layer can be removed by an etchant which does not attack the doped strip, so as to leave the doped strip in the desired pattern. However, this technique is also limited as to the narrowness of the strip or line which can be formed both because of the techniques generally used to form the opening in the masking layer and because the dopant, when diffused into the polycrystalline silicon layer, spreads out laterally to form a doped line which is wider than the opening in the masking layer.

SUMMARY OF THE INVENTION

A semiconductor device is provided with a narrow conductive strip by first forming a layer of polycrystalline silicon having an exposed edge and a masking layer on the polycrystalline silicon layer extending at least to the exposed edge of the polycrystalline silicon layer. A P-type dopant is embedded into the exposed edge of the polycrystalline silicon layer for a desired distance laterally along the polycrystalline silicon layer. The masking layer is removed and the undoped portion of the polycrystalline silicon layer is then removed.

BRIEF DESCRIPTION OF THE DRAWINGS

FIGS. 1 through 5 are sectional views illustrating the steps of one way of carrying out the method of the present invention.

FIGS. 6–8 are sectional views illustrating the steps of another way of carrying out the method.

FIG. 9 is a sectional view of a dual gate MOS transistor made by the method of the present invention.

DETAILED DESCRIPTION OF THE INVENTION

Figure 10:
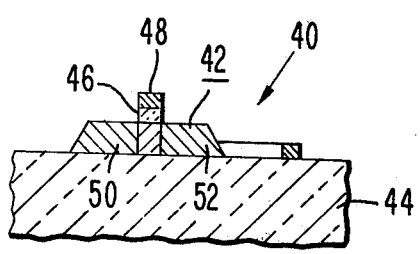
FIG. 10 is a sectional view of an MOS transistor made by the method of the present invention.

Referring to FIG. 1, in one way of making narrow conductive strips by the method of the present invention, a layer 10 of polycrystalline silicon is first deposited on a surface of a body 12. The body 12 may be a substrate of an insulating or semiconductive material or a layer of such a material on a substrate, depending on the device being made. The polycrystalline silicon layer 10 may be deposited by any well known technique, such as by the thermal decomposition of silane ($SiH_4$) diluted with hydrogen. A masking layer 14 is then coated over the polycrystalline silicon layer 10. The masking layer 14 may be of any material which will not be affected by etchants for the polycrystalline silicon, such as silicon dioxide. A silicon dioxide masking layer 14 may be formed by any technique well known in the semiconductor art, such as by the thermal decomposition of silane in an oxygen atmosphere or by the oxidation of the surface of the polycrystalline layer 10. A layer 16 of a photoresist material is then provided on a portion of the masking layer 14 using standard photolithographic techniques.

As shown in FIG. 2, the uncovered portion of the masking layer 14 is then removed, such as by etching with buffered HF, to expose a portion of the polycrystalline silicon layer 10. The exposed portion of the polycrystalline silicon layer 10 is then removed, such as with an anisotropic etchant ($KOH-H_2O$). When the polycrystalline silicon layer 10 is etched it will generally undercut the edge of the masking layer 14.

The device is then subjected to a P-type dopant and heated. For the P-type dopant, boron in the form of diborane may be used as the dopant source. Before carrying out the doping process, both ends of polycrystalline layer 10 may be masked, leaving only the lateral edges exposed. As indicated by the arrows 18 in FIG. 3, the dopant gas will contact the exposed edges of the polycrystalline silicon layer 10 so that the P-type dopant will diffuse into the polycrystalline silicon layer 10 laterally along the silicon layer from the exposed edges thereof. This will form a P-type doped strip 20 along each of the exposed edges of the polycrystalline silicon layer 10. Since the diffusion constant of the dopant is known and the diffusion of the dopant in the polycrystalline silicon layer 10 can be accurately controlled by the time and temperature of the diffusion, the width of the doped strips 20 can be accurately controlled to provide very narrow widths.

As shown in FIG. 4, the masking layer 14 is then removed with a suitable etchant exposing both the top surface of the doped portion and the undoped portions of the polycrystalline silicon layer 10. As described in the previously referred to U.S. Pat. No. 3,738,880 there are solvents in which intrinsic silicon is relatively soluble but in which P-doped silicon is substantially insoluble. Such solvents include aqueous hydrazine solutions, potassium hydroxide-propanol solutions, and the like. By subjecting the polycrystalline silicon layer to such a solvent, the undoped portion will be removed leaving the narrow strips 20 as shown in FIG. 5.

Referring now to FIGS. 6 through 8, there is shown the use of the method of the present invention for making the gate of a silicon-on-sapphire MOS transistor and simultaneously forming a conductive interconnection strip. In this method an island 22 of single crystalline silicon of either conductivity type is formed on a substrate 24 of an insulating material, such as single crystal alumina. As is well known in the silicon-on-sapphire technology, the silicon island 22 may be formed by epitaxially depositing a layer of single crystalline silicon on the substrate 24 and removing the portions of the silicon layer which do not form the island 22. The silicon island 22 is coated with a dielectric layer 26 preferably of silicon dioxide, such as by oxidizing the surface of the silicon island. A layer 28 of polycrystalline silicon is deposited over the oxide layer 26 and the exposed surface of the substrate 24 and a masking layer 30, preferably of silicon dioxide, is deposited over the polycrystalline silicon layer 28. As previously described with regard to FIGS. 1 and 2, portions of the masking layer 30 and the polycrystalline silicon layer 28 are removed to expose an edge of the polycrystalline silicon layer 28, which edge extends along and over a portion of the silicon island 22. As shown in FIG. 6, the masking layer 30 also is provided with an elongated opening 31 therethrough along the portion of the polycrystalline silicon layer 28 which is on the surface of the substrate 24.

As previously described with regard to FIG. 3, the device is then exposed to a P-type dopant and heated. As indicated by the arrow 32 in FIG. 7, this causes some of the dopant to diffuse into the exposed edge of the polycrystalline silicon layer 28 laterally along the polycrystalline silicon layer to form a narrow strip 34 of a P-type doped polycrystalline silicon. As indicated by the arrow 36, the gas will pass through the opening 31 in the masking layer 30 so that the dopant will diffuse into the exposed portion of the polycrystalline silicon layer 28 and form a second strip 38 of P-type doped polycrystalline silicon. As the P-type dopant diffuses into the polycrystalline silicon layer 28 to form the doped strip 38 the dopant will also diffuse laterally so that the doped strip 38 will be slightly wider than the width of the opening 31 in the masking layer 30.

As previously described with regard to FIG. 4, the masking layer 30 is then removed and the undoped portion of the polycrystalline silicon layer 28 is etched with an etchant which does not attack the doped portions leaving the narrow doped strip 34 along the silicon island 22 and the doped strip 38 along the substrate 24. Dopants of a conductivity type opposite to that of the silicon island 22 can then be embedded in the silicon island on opposite sides of the doped strip 34, such as by ion implantation, to form the source and drain regions of an MOS transistor. Thus, the doped strip 34 forms a narrow gate of the MOS transistor. The doped strip 38 can be used as an interconnection between the MOS transistor and other components on the substrate 24.

As shown in FIGS. 6 and 7, the polycrystalline silicon layer 28 has a second edge which is covered by a masking layer 33 to prevent diffusion of the P-type dopant into the polycrystalline silicon layer from the second edge. If an interconnection strip having a very narrow width is required, instead of providing the masking layer with an opening 31 through which the dopant is diffused into the polycrystalline silicon layer 28 to form the interconnecting strip, the masking layer 33 must not be provided over the second edge of the polycrystalline silicon layer so as to expose the second edge. The dopant would then be diffused into the polycrystalline silicon layer 28 through the second edge laterally along the polycrystalline silicon layer to permit the forming of a narrow doped strip which would form the interconnecting strip.

Although the wider polycrystalline strip 38 is shown as being an interconnection which is directly on the surface of the substrate 24, the wider strip can be formed as the gate of an MOS transistor. Thus, if an integrated circuit is being formed with two MOS transistors, one having a narrow gate and the other a wider gate, the polycrystalline silicon layer can be coated over the dielectric layer of two silicon islands. The masking layer and polycrystalline silicon layer could be defined to provide the polycrystalline silicon layer with an exposed edge along one of the islands and a surface region exposed through an opening in the masking layer along the other. Thus, after diffusing the P-type dopant into the exposed portions of the polycrystalline silicon layer and removing the undoped portions, a narrow gate would be provided over one of the islands and a wider gate region over the other island.

Referring to FIG. 9 there is shown a dual gate MOS transistor made by the present method. The dual gate MOS transistor includes an island 35 of single crystalline silicon on an insulating substrate 37. The silicon island 35 is coated with a dielectric layer 39, such as silicon dioxide, two spaced, parallel, narrow gates 41 of polycrystalline silicon are on the dielectric layer 39. The regions of the silicon island on opposite sides of the gates 41 are of a conductivity type opposite to that of the regions under the gates 41. To make the dual gate MOS transistor, a layer of polycrystalline silicon is deposited on the dielectric and defined by a masking layer to have two exposed edges on the silicon island, similarly as shown in FIG. 2. The P-type dopant is then diffused into the exposed edges of the polycrystalline silicon layer to form the two P-type doped strips. The masking layer and undoped portion of the polycrystalline silicon layer are then removed leaving the doped strips 41 on the island.

Figure 11:
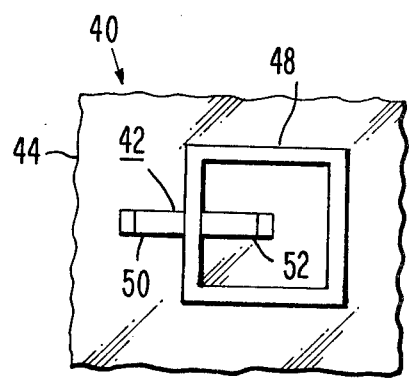
FIG. 11 is a top plan view of the MOS transistor shown in FIG. 10.

Referring to FIGS. 10 and 11 three is shown a silicon-on-sapphire MOS transistor 40 which can be formed by the method of the present invention. The transistor 40 comprises an island 42 of single crystalline silicon on a substrate 44 of single crystalline alumina. The silicon island 42 is in the form of an elongated rectangle and is initially of either conductivity type. On the island 42 is a narrow layer 46 of silicon dioxide which serves as the gate oxide. The gate oxide 46 extends across the island 42 intermediate the narrow ends of the island. A narrow strip 48 of polycrystalline silicon in the form of a rectangle is on the substrate 44 with one leg of the polycrystalline silicon strip 48 extending across the gate oxide layer 46 as to form the gate of the transistor 40. The portions of the silicon island 42 at opposite sides of the gate oxide 46 are of a conductivity type opposite the initial conductivity of the island 42 to form the source and drain regions 50 and 52 respectively. Although the polycrystalline silicon strip 48 is shown as being in the form of a rectangle, it can be in any enclosed form, such as circular, as long as a portion extends over the gate oxide layer 46.

Figure 12:
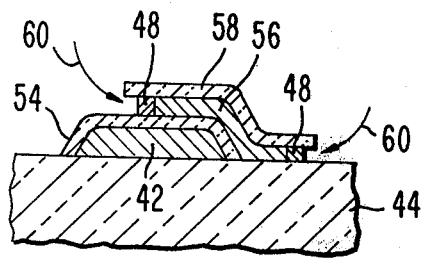
FIG. 12 is a sectional view illustrating the method of making the MOS transistor shown in FIGS. 10 and 11.

As shown in FIG. 12, the transistor 40 is formed by epitaxially depositing a layer of single crystal silicon on the substrate 44 and removing portions of the single crystalline silicon layer to form the island 42. A layer 54 of silicon dioxide is formed on the surface of the island 42, such as by oxidizing the surface of the island. A layer 56 of polycrystalline silicon is then deposited on the oxide layer 54 and on the surface of the substrate 44, and a masking layer 58, preferably of silicon dioxide is formed over the polycrystalline silicon layer 56. A photoresist layer is then coated over the portion of the masking layer 58 where the polycrystalline silicon strip 48 is to be formed. The uncovered portions of the masking layer 58 are removed, such as with a suitable etchant, to expose portions of the polycrystalline silicon layer 56 which are then removed using a suitable etchant. This leaves a substantially rectangular region of the polycrystalline silicon layer 56 and masking layer 58 as indicated in FIG. 12, with the edges of the polycrystalline silicon layer 56 being exposed. The device is then exposed to a gas containing a P-type dopant and heated. As indicated by the arrows 60, the gas contacts the exposed edges of the polycrystalline silicon layer 56 so that P-type dopant diffuses into the polycrystalline silicon layer 56 laterally therealong from the exposed edges to form the rectangular doped strip 48. The masking layer 58 is then removed with a suitable etchant and the undoped portions of the polycrystalline silicon layer 56 are removed with an etchant which does not attack the P-type doped strip 48. The portions of the oxide layer 54 which are then exposed on each side of the doped strip 48 are then removed with a suitable etchant to form the gate oxide 46. A suitable dopant can then be embedded in the exposed portions of the island 42, such as by diffusion or ion implantation, to form the source and drain regions 50 and 52.

Figure 14:
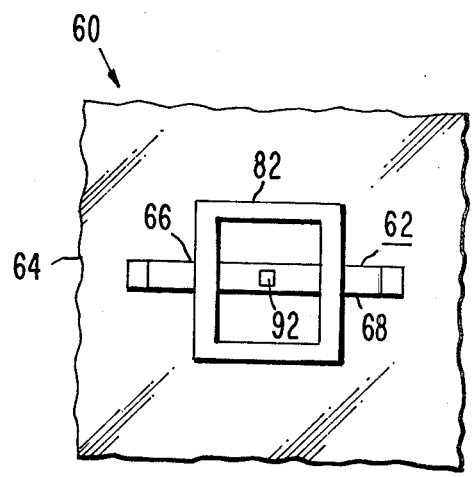
FIG. 14 is a top plan view of the inverter shown in FIG. 13.
Figure 13:
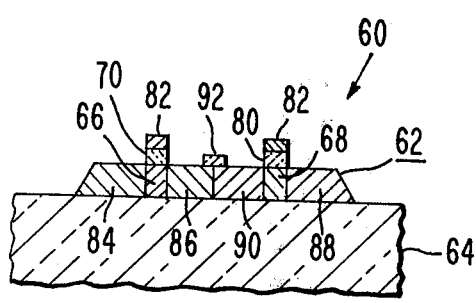
FIG. 13 is a sectional view of an inverter made by the method of the present invention.

Referring to FIGS. 13 and 14 there is shown an inverter 60 formed by the method of the present invention. The inverter 60 is a P-channel MOS transistor and an N-channel MOS transistor having common drains and common gates. The inverter 60 comprises an island 62 of single crystalline silicon on a substrate 64 of single crystalline alumina. The silicon island 62 is in the form of an elongated rectangle with one portion 66 being initially of one conductivity type and the remaining portion 68 being of the opposite conductivity type. A narrow gate oxide layer 70 extends across the one portion 66 of the island 62 and a narrow gate oxide strip 80 extends across the other portion 68. A narrow strip 82 of a polycrystalline silicon in the form of a rectangle is on the substrate 64 with one arm of the polycrystalline strip 82 extending over the gate oxide strip 70 and another arm of the polycrystalline silicon strip 82 extending across the gate oxide strip 80. The regions of the first portion 66 of the island 62 on opposite sides of the gate oxide 70 are doped to form the source and drain regions 84 and 86 of one of the MOS transistors, and the regions of the second portion 68 on opposite sides of the gate oxide 80 are doped to form source and drain regions 88 and 90 of the second MOS transistor. A metal film 92 extends across the junction between the drain regions 86 and 90 to electrically connect the two drain regions. Thus there is formed two MOS transistors having connected drain regions and a common gate.

The inverter 60 is formed in the same manner as described above with regard to the transistor 40 except that the silicon island is made larger and the polycrystalline silicon strip 82 is formed with two exposed legs extending across the appropriate portions of the island. By forming on the substrate 64 a plurality of the inverters arranged in rows, various circuits can be formed, such as a shift register stage.

What is claimed is:

1. A semiconductor device comprising:
    a substrate of an insulating material;
    an island of semiconductor material on the substrate, the island being in the shape of an elongated rectangle having two connected portions, each portion having drain, source and channel regions, the drain and source regions of one of the portions being of one conductivity type and the drain and source regions the other of the portions being of an opposite conductivity type;
    a strip of oxide on and extending across each of the channel regions of the semiconductor island; and
    a narrow strip of P-type polycrystalline silicon extending across the substrate and on each oxide strip, the polycrystalline silicon strip being in an enclosed form and insulated from the island by each strip of oxide.

2. A semiconductor device in accordance with claim 1, wherein:
    the channel region of each of the connected portions is of opposite conductivity type to its respective source and drain regions.

* * * * *